US011193832B2

(12) United States Patent
Suzuki et al.

(10) Patent No.: US 11,193,832 B2
(45) Date of Patent: Dec. 7, 2021

(54) INFRARED DETECTOR, IMAGING DEVICE INCLUDING THE SAME, AND MANUFACTURING METHOD FOR INFRARED DETECTOR

(71) Applicant: FUJITSU LIMITED, Kawasaki (JP)

(72) Inventors: Ryo Suzuki, Fujisawa (JP); Hironori Nishino, Isehara (JP); Koji Tsunoda, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 2 days.

(21) Appl. No.: 16/777,933

(22) Filed: Jan. 31, 2020

(65) Prior Publication Data

US 2020/0292391 A1    Sep. 17, 2020

(30) Foreign Application Priority Data

Mar. 14, 2019    (JP) .............................. JP2019-047590

(51) Int. Cl.
  *G01J 5/20*    (2006.01)
  *H01L 27/146*    (2006.01)
  (Continued)

(52) U.S. Cl.
  CPC .......... *G01J 5/20* (2013.01); *H01L 27/14649* (2013.01); *H01L 31/101* (2013.01); *G01J 2005/0077* (2013.01); *G01J 2005/204* (2013.01)

(58) Field of Classification Search
  CPC ................ G01J 5/20; G01J 2005/204; G01J 2005/0077; G01J 5/0225; H01L 27/14649;
  (Continued)

(56) References Cited

U.S. PATENT DOCUMENTS

2011/0235676 A1* 9/2011 Noda ................. G01J 5/20
  374/163
2012/0161003 A1* 6/2012 Tsuchiya ............ G01J 5/024
  250/338.3
(Continued)

FOREIGN PATENT DOCUMENTS

JP    11-153482 A    6/1999
WO    2013/157180 A1    10/2013

OTHER PUBLICATIONS

Salihoglu, Omer et al., "A Comparative Passivation Study for InAs/GaSb Pin Superlattice Photodetectors", IEEE Journal of Quantum Electronics, vol. 49, No. 8, pp. 661-666, Aug. 2013.

(Continued)

*Primary Examiner* — Kiho Kim
(74) *Attorney, Agent, or Firm* — Fujitsu Patent Center

(57) ABSTRACT

An infrared detector includes: a laminate of semiconductor in which a first electrode layer, a light receiving layer, and a second electrode layer are laminated in this order; a first insulating film configured to be in contact with the laminate and covers a surface of the laminate; and a second insulating film configured to be in contact with and covers a surface of the first insulating film opposite to an interface between the first insulating film and the laminate, wherein the first insulating film is configured to have a lower Gibbs free energy than an oxide of a material from which the laminate is formed, and in the second insulating film, diffusion of impurity is larger than in the first insulating film.

7 Claims, 14 Drawing Sheets

(51) Int. Cl.
*H01L 31/101* (2006.01)
*G01J 5/00* (2006.01)

(58) Field of Classification Search
CPC ............. H01L 31/101; H01L 31/02161; H01L 31/105; H01L 31/035236; H01L 27/1467; H01L 27/14694
See application file for complete search history.

(56) References Cited

U.S. PATENT DOCUMENTS

| | | | |
|---|---|---|---|
| 2013/0015547 A1* | 1/2013 | Hamano | H01L 27/307 257/436 |
| 2014/0138522 A1* | 5/2014 | Hamano | H01L 51/44 250/208.1 |
| 2015/0021731 A1 | 1/2015 | Yazawa et al. | |
| 2015/0097157 A1* | 4/2015 | Onakado | H01L 27/14649 257/21 |
| 2017/0250156 A1* | 8/2017 | Endo | H04N 5/2256 |
| 2018/0122971 A1* | 5/2018 | Fuyuki | H01L 31/035236 |

OTHER PUBLICATIONS

Tian, Zhaobing et al., "Low Dark Current Structures for Long-wavelength Type-II Strained Layer Superlattice Photodiodes", Proceedings of SPIE, vol. 8704, pp. 870415-1-870415-11, Jun. 11, 2013.

\* cited by examiner

FIG. 3

| OXIDE | ENERGY OF FORMATION 25°C [kcal/mol] |
|---|---|
| $Ga_2O$ | -75.3 |
| $Ga_2O_3$ | -238.6 |
| $In_2O_3$ | -198.6 |
| $As_2O_3$ | -137.7 |
| $As_2O_5$ | -187.0 |
| $Sb_2O_3$ | -151.5 |
| $Sb_2O_5$ | -198.2 |
| $Al_2O_3$ | -377.9 |
| $HfO_2$ | -260.1 |
| $TiO_2$ | -211.0 |
| $SiO_2$ | -204.7 |

FIG. 4

|  | DIFFUSION LENGTH [mm] |
|---|---|
| ALUMINUM OXIDE | 2.3 |
| SILICON OXIDE | 5.5 |

INFRARED DETECTOR, IMAGING DEVICE INCLUDING THE SAME, AND MANUFACTURING METHOD FOR INFRARED DETECTOR

CROSS-REFERENCE TO RELATED APPLICATION

This application is based upon and claims the benefit of priority of the prior Japanese Patent Application No. 2019-47590, filed on Mar. 14, 2019, the entire contents of which are incorporated herein by reference.

FIELD

The present invention is related to an infrared detector, an imaging device including the same, and a manufacturing method for an infrared detector.

BACKGROUND

Type-II superlattice (T2SL) has been expected as an alternative next-generation infrared detector material to mercury cadmium telluride (MCT), and widely studied. In many of those, a superlattice structure is formed by growing a material having a lattice constant close to that of a GaSb substrate, such as GaSb, InAs, or AlSb, over a GaSb substrate. By using the superlattice structure of these materials as a light absorption layer, it is possible to detect infrared light from a medium infrared region (3 to 5 μm) to a far infrared region (8 to 12 μm), which is applicable to fields such as security and infrastructure inspection.

Reducing a dark current in a detector in which T2SL is applied to the light receiving layer is a problem. For example, when a light receiving layer is mesa-processed to form a detector, the periodicity of the crystal structure at an end surface thereof is disturbed, so that many surface levels are generated, which is a cause of surface leakage current. Generally, attempts have been made to reduce leakage current by forming an insulating film covering an exposed end face.

NPL 1 discloses that when an aluminum oxide film is used as an insulating film, the leakage current is suppressed more than in the case of a silicon oxide film. In contrast, in NPL 2, even when an aluminum oxide film is used as an insulating film, the leakage current is not reduced. An insulating film formation process for an infrared detector is still not yet mature.

Examples of the related art include NPL 1 {J. Quant. Electron Vol. 49, pp. 661 (2013)} and NPL 2 {SPIE Proceedings, Vol. 8704, pp. 870415 (2013)}.

SUMMARY

According to an aspect of the embodiments, an infrared detector includes: a laminate of semiconductor in which a first electrode layer, a light receiving layer, and a second electrode layer are laminated in this order; a first insulating film configured to be in contact with the laminate and covers a surface of the laminate; and a second insulating film configured to be in contact with and covers a surface of the first insulating film opposite to an interface between the first insulating film and the laminate, wherein the first insulating film is configured to have a lower Gibbs free energy than an oxide of a material from which the laminate is formed, and in the second insulating film, diffusion of impurity is larger than in the first insulating film.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 illustrates the energy of formation of various oxides;

FIG. 4 illustrates diffusion length of insulating oxides used in the embodiment;

DESCRIPTION OF EMBODIMENT(S)

An object of the present invention is to provide a configuration and a method for suppressing the dark current of an infrared detector and improving the detection performance.

It is possible to suppress the dark current of the infrared detector, and improve the performance of the detector.

In an infrared detector in which, for example, T2SL is applied to a light receiving layer, a dark current $I_d$ is represented by the formula (1).

$$I_d = I_{Bulk} + I_{surface} \quad (1)$$

The first term on the right side of the formula (1) is a bulk component $I_{Bulk}$ flowing through the inside of the light receiving layer, and the second term on the right side is a component $I_{surface}$ flowing in a side wall surface and the vicinity thereof of the light receiving layer. In improving the performance of the detector, it is important to reduce the current component (hereinafter referred to as "surface leakage current") flowing in the side wall surface and the vicinity thereof.

The inventors have found that removing an oxide film over the semiconductor surface at an interface between the insulator and semiconductor and reducing the concentration of impurity such as carbon or hydrogen in the vicinity of the interface is effective for reducing the surface leakage current. Here, the impurity is an element that constitutes an organic compound such as carbon or hydrogen, and is an element that does not contribute to the formation of a semiconductor layer.

The inventors further have found that, although an aluminum oxide film has an effect of removing an oxide film over a semiconductor surface, the impurity tends to accumulate in the vicinity of the interface, and the impurity accumulated in the vicinity of the interface serves as a cause of a surface leakage current.

In the embodiment described below, while maintaining the effect of removing the oxide film over the semiconductor surface at the interface between the insulator and the semiconductor, dark current flowing in the infrared detector is suppressed by reducing the impurity in the vicinity of the interface.

Figure 1:
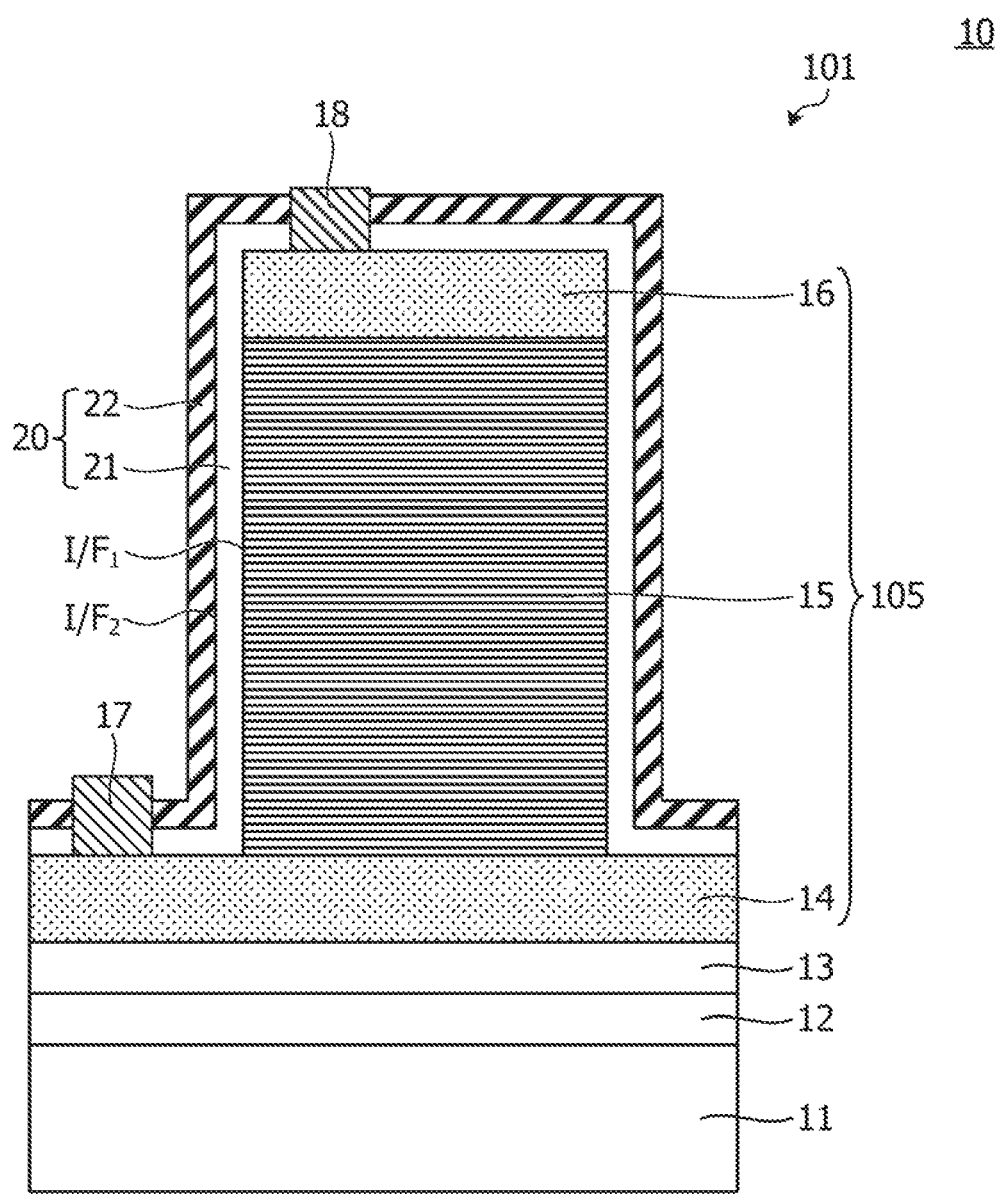
FIG. 1 is a schematic section view of an infrared detector according to an embodiment.

FIG. 1 is a schematic section view illustrating a basic structure of an infrared detector 10 as an example of the infrared detector. Although a cross-sectional configuration of one pixel 101 is illustrated for the sake of convenience of illustration, a pixel array in which a large number of pixels or light receiving elements are arranged in a two-dimensional plane is formed as will be described later.

In the infrared detector 10, a buffer layer 12, an etching stopper layer 13, a first electrode layer 14, a light receiving layer 15, and a second electrode layer 16 are epitaxially grown in this order over a substrate 11. The first electrode layer 14 is shared among a plurality of pixels 101 included in the pixel array. The light receiving layer 15 and the second electrode layer 16 are processed into predetermined shapes to form individual pixels 101. A laminate 105 of semiconductor that detects incident infrared light as a charge amount is formed of the first electrode layer 14, the light receiving layer 15, and the second electrode layer 16. The laminate 105 is formed of a superlattice structure of narrow-gap semiconductor such as InAs, GaSb, or InAsSb, or a mixed crystal of these.

A passivation layer 20 having a bilayer structure is formed so as to cover the upper surface and side surface of the light receiving layer 15 and the second electrode layer 16, and the upper surface of the first electrode layer 14. Here, the "upper surface" refers to an upper surface in the lamination direction or the growth direction in a film formation process of the infrared detector 10. Therefore, even when the infrared detector 10 is arranged in an inverted direction by flip chip mounting or the like, the "upper surface" is a surface on the upper side as viewed in the lamination direction or the growth direction.

The passivation layer 20 is constituted by a first insulating film 21 and a second insulating film 22. The first insulating film 21 is in contact with the light receiving layer 15, the first electrode layer 14, and the second electrode layer 16. A surface of the first insulating film 21 in contact with the laminate 105 constituted by the light receiving layer 15, the first electrode layer 14, and the second electrode layer 16 will be referred to as a first interface ($I/F_1$).

The second insulating film 22 is in contact with the first insulating film 21 at a surface opposite to the first interface of the first insulating film 21. The surface where the first insulating film 21 and the second insulating film 22 contact each other will be referred to as a second interface ($I/F_2$).

A part of the first insulating film 21 and the second insulating film 22 constituting the passivation layer 20 is removed over the upper surface of the second electrode layer 16, and an ohmic electrode 18 is provided. The ohmic electrode 18 is a separate electrode provided for each pixel 101, and is in ohmic contact with the second electrode layer 16.

In the outermost periphery of a pixel region, a part of the first insulating film 21 and the second insulating film 22 is removed over the upper surface of the first electrode layer 14, and an ohmic electrode 17 is provided. The ohmic electrode 17 is in ohmic contact with the first electrode layer 14. The first electrode layer 14 serves as a common contact layer shared by all of the pixels 101.

In the passivation layer 20, the first insulating film 21 in contact with the laminate 105 is formed from an insulating material having a lower Gibbs free energy than oxide of a material used in the laminate 105. The low Gibbs free energy means that a more stable bond is obtained in an isothermal isobaric process of the system. Gibbs free energy may also be referred to as the energy of formation of a compound.

As a result of forming the first insulating film 21 from a material having a lower energy of formation than the oxide of the material of the laminate 105, oxygen contained in the oxide film over the surface of the laminate 105 is inclined toward being more stably combined with the first insulating film 21. As a result, the oxide film over the surface of the laminate 105 is decomposed and removed. As a result of removal of the oxide film over the surface, the influence of the leakage current derived from the semiconductor oxide is reduced at the first interface between the laminate 105 and the first insulating film 21.

In particular, in end faces of the second electrode layer 16 and the light receiving layer 15 that are mesa-processed, many surface levels are generated due to disturbance of the periodicity of the crystal structure, and the leakage current is likely to flow via these surface levels. By removing the semiconductor oxide over the mesa surface, the occurrence of leakage current is suppressed.

The material from which the first insulating film 21 is formed is determined by the relative relationship with the oxide of the semiconductor material used in the laminate 105. For example, when the laminate 105 is formed of a superlattice of InAs/GaSb, gallium oxide, antimony oxide, indium oxide, and arsenic oxide are formed over the surface of the laminate 105. The first insulating film 21 is formed from a material having a lower Gibbs free energy than these oxides, that is, a material having a lower energy of formation of oxide. Examples of such a material include aluminum oxide and hafnium oxide.

When the superlattice of the laminate 105 is formed from a material other than InAs/GaSb, another material may be further used for the first insulating film 21. A specific example of a combination of materials will be described later with reference to FIG. 3.

The second insulating film 22 is formed from a material having a larger impurity diffusion in the film than the first insulating film 21. Since the first insulating film 21 is formed from a material having a low Gibbs free energy and has a relatively high film density, an impurity constituting organic compounds such as carbon (C) or hydrogen (H) are likely to remain in the first insulating film 21. In some cases, an impurity with which the first electrode layer 14 and the second electrode layer 16 are doped may get into the first insulating film 21 from the first interface ($I/F_1$). The impurity present in the first interface and the first insulating film 21 also cause a surface leakage current.

In the embodiment, by forming the second insulating film 22 from a material having a larger impurity diffusion in the film than the first insulating film 21, an impurity present in the first insulating film 21 is separated from the first interface ($I/F_1$) as much as possible. The impurity in the first insulating film 21 is diffused from the second interface ($I/F_2$) to the surface side of the second insulating film 22 to suppress the cause of the surface leakage current.

Examples of the material of the second insulating film 22 having a larger impurity diffusion in the film than the first insulating film 21 include silicon oxide and silicon nitride.

The passivation layer 20 has a bilayer structure including the first insulating film 21 having a lower Gibbs free energy than an oxide of the semiconductor material of the laminate 105 and the second insulating film 22 having a larger impurity diffusion in the film than the first insulating film 21. Thus, the dark current is suppressed by removing the oxide film over the surface of the laminate 105 and separating the impurity from the first interface and the second interface.

FIGS. 2A to 2E are schematic section views illustrating a manufacturing process of the infrared detector 10 of the embodiment. Although FIGS. 2A to 2E illustrate manufacturing steps by focusing on one pixel for the sake of convenience of illustration, in actuality, many pixels constituting the image pixel array are manufactured at once.

Figure 2A:
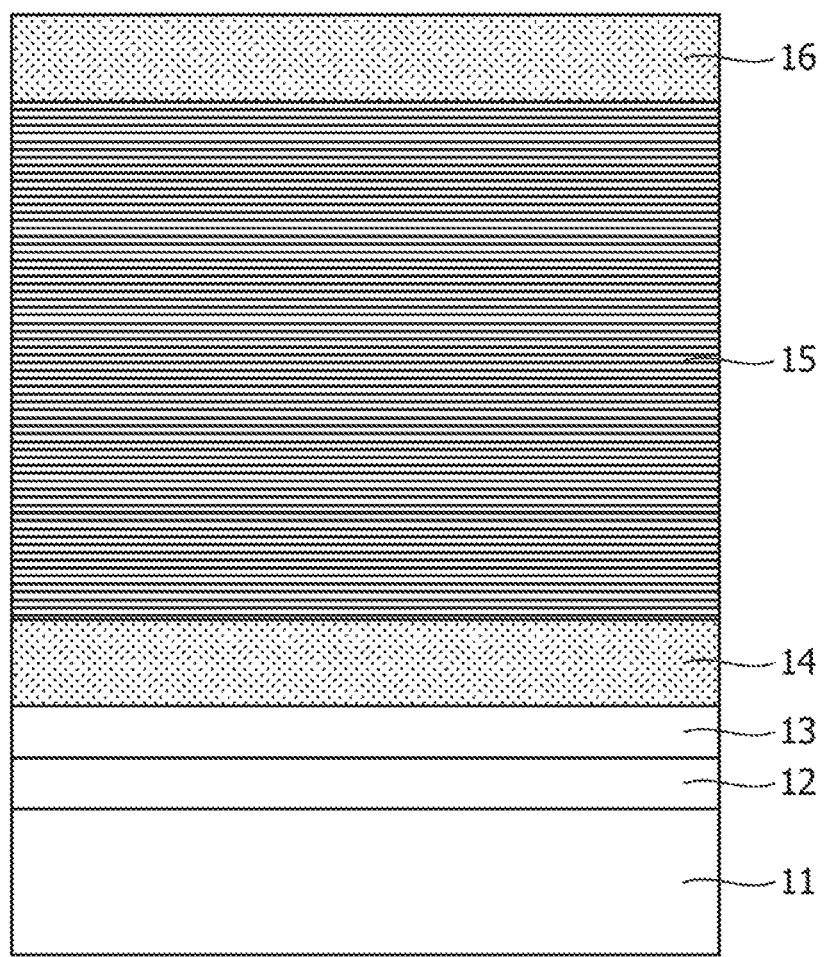
FIG. 2A is a schematic section view illustrating a manufacturing method for the infrared detector.

First, in FIG. 2A, the buffer layer 12, the etching stopper layer 13, the first electrode layer 14, the light receiving layer 15, and the second electrode layer 16 are grown over the substrate 11 in this order by molecular beam epitaxy (MBE).

For example, an n-type GaSb (100) substrate is introduced into a load lock chamber of an MBE apparatus. The GaSb substrate is subjected to degassing in a preparation chamber of the apparatus, and then transferred to a growth chamber which is maintained at an ultra high vacuum. The substrate 11 transferred to the growth chamber is heated under a Sb atmosphere to remove the oxide film over the surface.

After removing the oxide film, the buffer layer 12 (for example, a buffer layer of GaSb) for improving flatness of the surface of the substrate 11 is grown to 100 nm at a substrate temperature of 500° C.

Then, for example, the etching stopper layer 13 of InAsSb is grown to 300 nm. The alloy composition of the InAsSb layer serving as an etching stopper is preferably set to lattice-match with GaSb, and is set to, for example, $InAs_{0.91}Sb_{0.09}$.

Then, the first electrode layer 14 of InAs/GaSb superlattice is grown. For example, InAs having a thickness of 2.4 nm and GaSb having a thickness of 2.1 nm are formed as one unit, and this is repeatedly formed. The first electrode layer 14 is, for example, a p-type electrode layer of GaSb doped with Be, and has a hole concentration of $1 \times 10^{18}$ $cm^{-3}$. The InAs/GaSb superlattice is repeatedly grown by 80 units to a thickness of 360 nm.

Then, the light receiving layer 15 of the InAs/GaSb superlattice is formed. The superlattice is formed by, for example, InAs of a thickness of 2.4 nm and GaSb of a thickness of 2.1 nm. The light receiving layer 15 is an undoped layer, and is grown to a thickness of 1300 nm by repeatedly forming the superlattice.

Then, the second electrode layer 16 of InAs/GaSb superlattice is formed. The superlattice is formed by, for example, InAs of a thickness of 2.4 nm and GaSb of a thickness of 2.1 nm. The second electrode layer 16 is, for example, an n-type electrode layer of InAs doped with Si, and has an electron concentration of $1 \times 10^{18}$ $cm^{-3}$. The second electrode layer 16 is grown to a thickness of 360 nm.

Thus, a laminated structure including the laminate 105 is obtained.

Figure 2B:
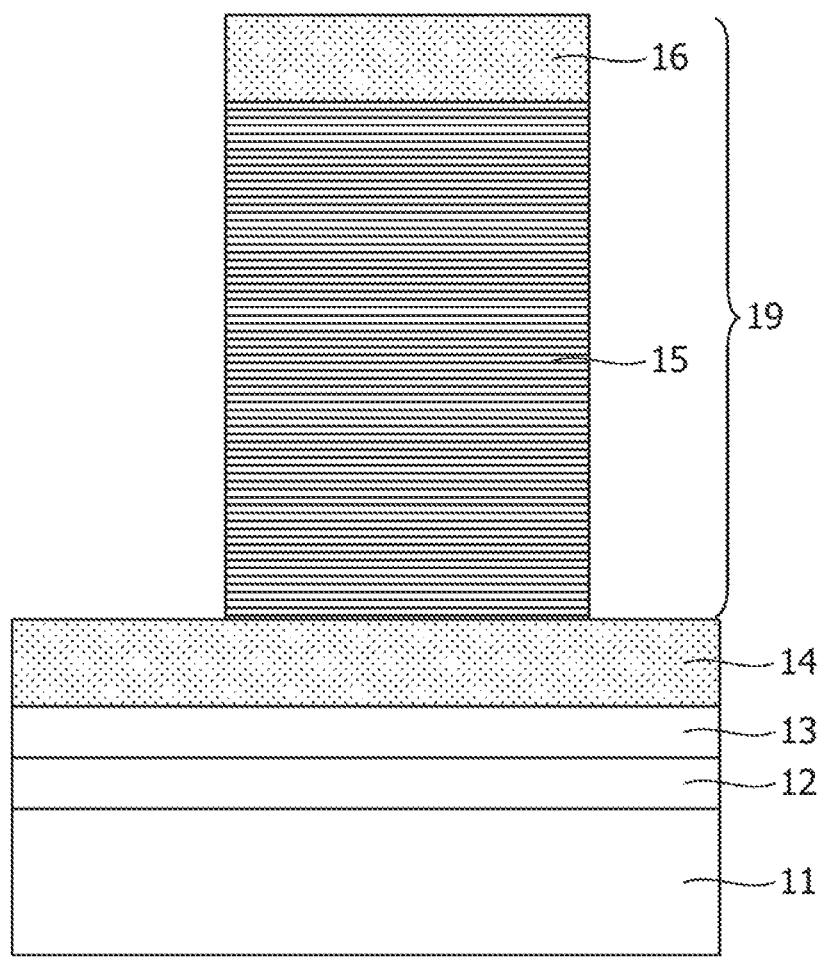
FIG. 2B is a schematic section view illustrating the manufacturing method for the infrared detector.

In FIG. 2B, a mesa 19 for each pixel is formed. The second electrode layer 16 and the light receiving layer 15 are selectively etched so that a part of the surface of the first electrode layer 14 is exposed. As the technique of selective etching, any suitable technique known in the art may be used. For example, a hard mask layer is formed from SiON over the second electrode layer 16. A resist mask of a pixel is formed over the SiON layer by lithography, and the SiON layer is processed by reactive ion etching (RIE) using a fluorine-based gas. The mesa 19 is formed by etching the second electrode layer 16 and the light receiving layer 15 by RIE using a chlorine-based gas by using an SiON hard mask. At this time, it is preferable that the etching is finished so that the InAs is the outermost surface of the superlattice of the first electrode layer 14. Thereafter, etching damage generated in side walls of the mesa 19 is removed by wet etching, and the SiON hard mask is removed.

Figure 2C:
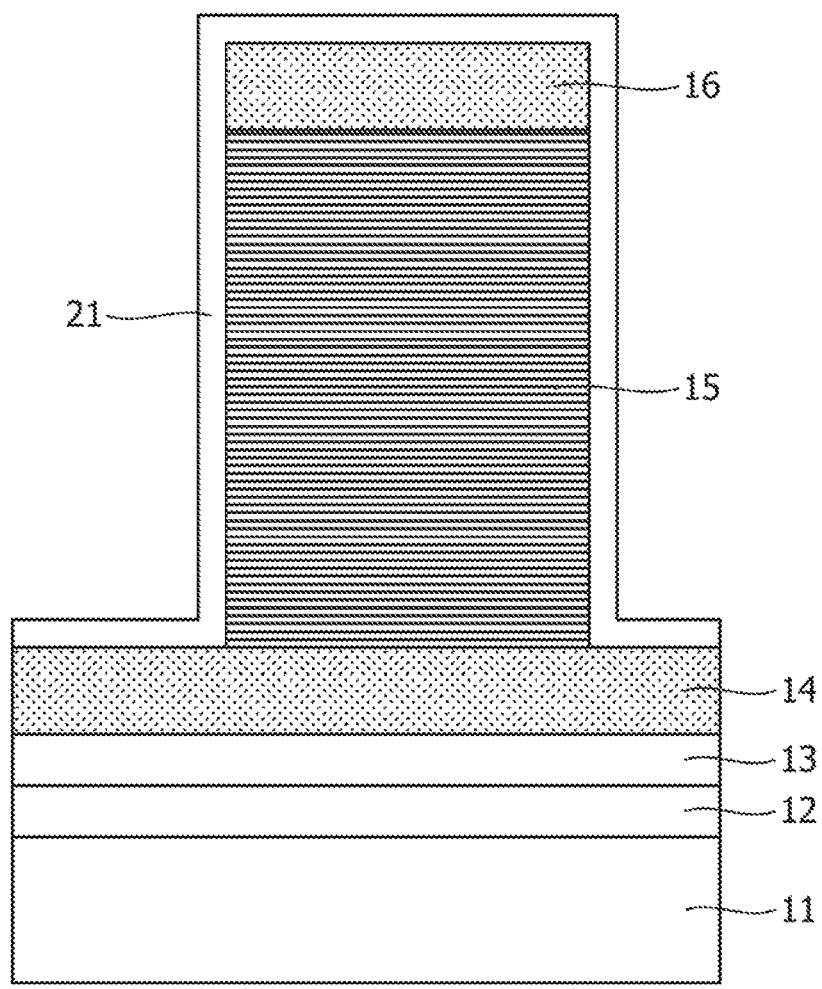
FIG. 2C is a schematic section view illustrating the manufacturing method for the infrared detector.

In FIG. 2C, the first insulating film 21 is formed to cover the top surface and side surface of the mesa 19, and the exposed surface of the first electrode layer 14. As described above, the first insulating film 21 is formed from a material having a lower Gibbs free energy than the oxide of the semiconductor material of the mesa 19. For example, the first insulating film 21 of aluminum oxide is formed to 25 nm by an atomic layer deposition method using trimethylaluminum as a precursor and water as an oxidant source at a film formation temperature of 200° C. Aluminum oxide has a lower Gibbs free energy than gallium oxide, antimony oxide, indium oxide, or arsenic oxide which constitutes the surface oxide film of the laminate 105 (see FIG. 1). The oxide film over the surface of the mesa 19 and the surface of the first electrode layer 14 is decomposed and reduced by the first insulating film 21.

Figure 2D:
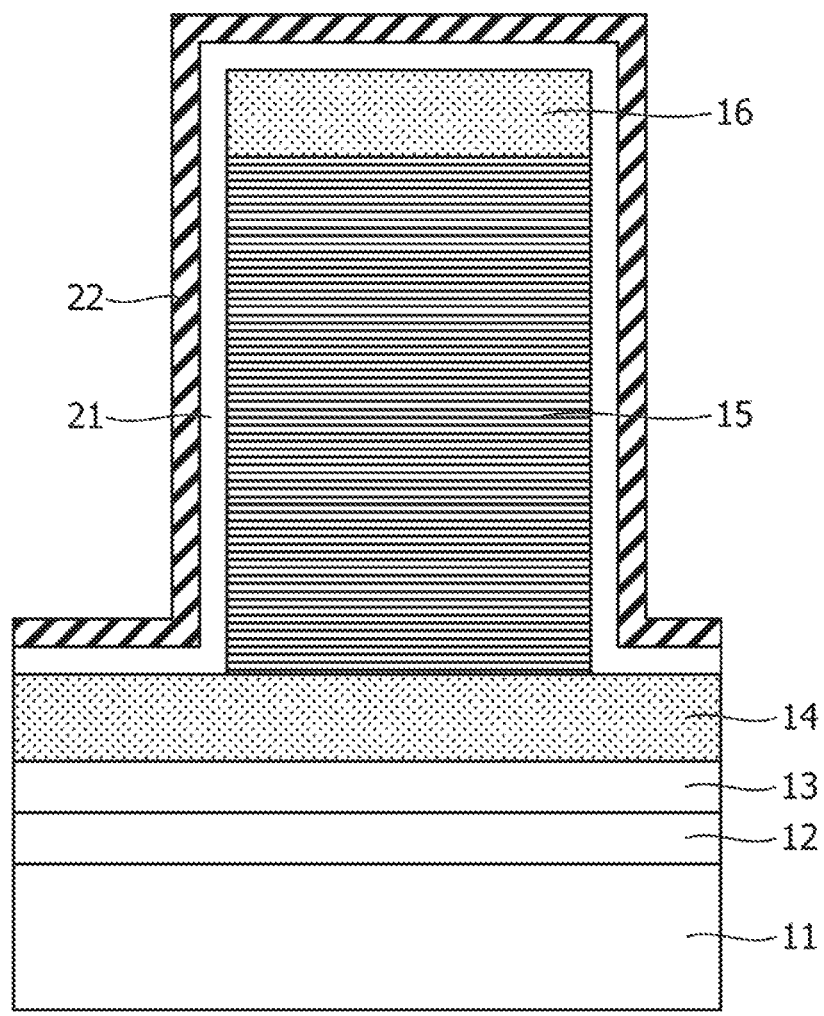
FIG. 2D is a schematic section view illustrating the manufacturing method for the infrared detector.

In FIG. 2D, the second insulating film 22 is formed over the surface of the first insulating film 21 by, for example, a chemical vapor deposition method. For example, a film of silicon oxide ($SiO_2$) is formed to 500 nm by using silane ($SiH_4$) and dinitrogen oxide ($N_2O$) as reaction gases. Since the diffusion length of the impurity such as carbon is larger in the silicon oxide than in aluminum oxide of the first insulating film 21, it is possible to separate carbon from the interface between the first insulating film 21 and the mesa 19.

Figure 2E:
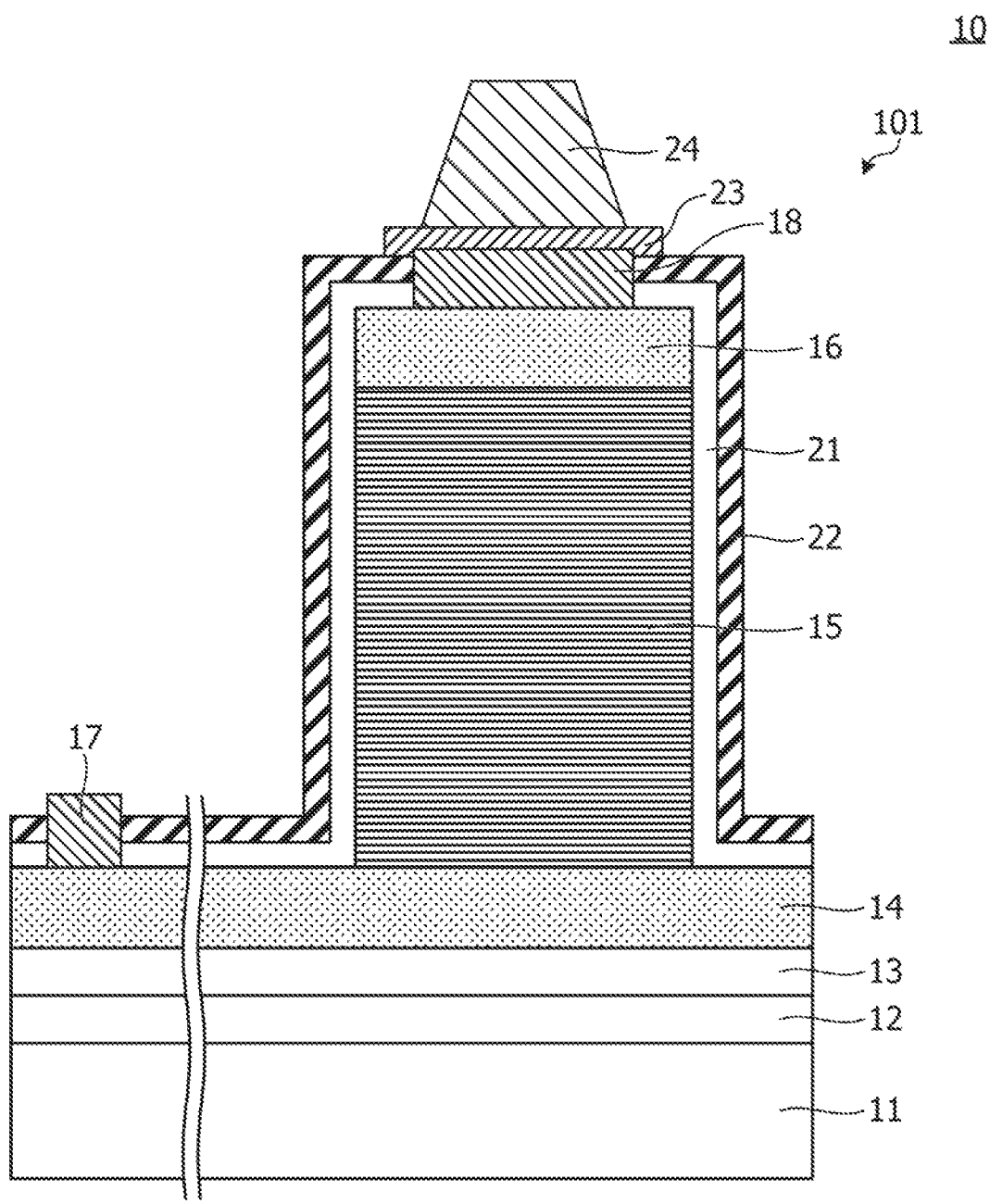
FIG. 2E is a schematic section view illustrating the manufacturing method for the infrared detector.

In FIG. 2E, the first insulating film 21 and the second insulating film 22 are selectively etched by etching using a mask so that a part of the second electrode layer 16 and the first electrode layer 14 is exposed. The ohmic electrode 18 is formed at a position in an upper portion of the mesa 19 where the first insulating film 21 and the second insulating film 22 are selectively removed. Further, the ohmic electrode 17 is formed at a position in the surface of the first electrode layer 14 in the outermost periphery of the pixel array where the first insulating film 21 and the second insulating film 22 are selectively removed. The ohmic electrodes 17 and 18 are formed as, for example, laminates of Ti/Pt/Au. Further, an electrode pad 23 coupled to the ohmic electrode 18 is formed over the mesa 19 by a lift-off method, a bump electrode 24 is formed over the electrode pad 23 from indium or the like, and thus the infrared detector 10 is obtained. The electrode pad 23 is formed of, for example, a Ti/Pt film, and serves as a base electrode of the bump electrode 24.

In the infrared detector 10 manufactured by the above process, the oxide film over the surface of the laminate 105 of semiconductor is decomposed by the first insulating film 21, the impurity in the vicinity of the interface is separated from the interface by the second insulating film 22, and thus the dark current is suppressed.

FIG. 3 illustrates the energy of formation of various oxides. The energy of formation of oxides of the materials used for the superlattice of the infrared detector at 25° C. is illustrated. Compared with the energy of formation of oxides of Ga, Sb, In, and As constituting the light receiving layer 15, the energy of formation of aluminum oxide ($Al_2O_3$) is −377.9 (kcal/mol), which is a small value. It is more energetically stable for the oxygen making up the surface oxide film to form aluminum oxide. Also, the energy of formation of hafnium oxide ($HfO_2$) is −260.1 (kcal/mol), which is smaller than the energy of formation of oxides of Ga, Sb, In, and As.

Although a superlattice of InAs/GaSb is used for the laminate 105 of semiconductor in the embodiment, the laminate 105 including a light receiving layer may be sometimes formed of superlattice such as InAs/InAsSb, InAs/InSb, InAsSb/InSb, or InAsSb/InAsSb. In this case, $Al_2O_3$, $HfO_2$, and also $TiO_2$ may be used for the first insulating film 21 having a lower energy of formation than oxides of In, As, and Sb. By forming the first insulating film 21 from a material having a lower Gibbs free energy than the oxide making up the surface oxide film of the laminate 105, it is possible to decompose and reduce the surface oxide film.

The energy of formation of $SiO_2$ is −204.7 (kcal/mol), but it is possible to reduce the energy of formation by adding one or more elements that form stable oxides such as aluminum (Al), hafnium (Hf), titanium (Ti), and zirconium (Zr) to $SiO_2$. This will be explained in more detail in a modification example that will be described later.

FIG. 4 illustrates the diffusion length of impurity of insulating materials from which the passivation layer 20 is formed. The diffusion length of impurity in film formation is represented by the formula (2).

$$N = N_0 \cdot \exp(-s/a) \quad (2)$$

Here, N represents the impurity concentration in the insulating film at an arbitrary distance from the interface (first interface $I/F_1$) between the insulating film and the semiconductor. $N_0$ is the initial concentration of impurity at the interface between the insulating film and the semiconductor, s is the distance from the interface, and a is the diffusion length. A larger diffusion length indicates that the impurity is separated more from the interface.

FIG. 4 illustrates experimentally obtained values of diffusion length of carbon in a film of aluminum oxide and in a film of silicon oxide. In the experiment, a sample in which an aluminum oxide film is formed over a GaSb substrate and a sample in which a silicon oxide film is formed over a GaSb substrate are prepared. In each sample, the concentration of carbon (C) in the depth direction from the surface of the oxide film is measured by secondary-ion mass spectrometry (SIMS), and thus a concentration profile in the depth direction is obtained.

In the concentration profile, the C concentration is high in the vicinity of the interface between the GaSb substrate and the oxide film, and the C concentration gradually decreases toward the surface of the oxide film. Then, the C concentration quickly increases in the vicinity of the surface of the oxide film due to the influence of organic substances or the like adhering to the surface of the oxide film.

It is possible to obtain the diffusion length of the impurity in the film thickness direction from the interface between the GaSb substrate and the oxide film from the gradient of the concentration profile in the film thickness direction of the oxide film from the interface. As a result of the calculation, the diffusion length in aluminum oxide is 2.3 nm, and the diffusion length in silicon oxide is 5.5 nm.

It is considered that the diffusion lengths of carbon in films of hafnium oxide ($HfO_2$) and titanium oxide ($TiO_2$) used for the first insulating film 21 are, based on the low bonding energy and high film density thereof, also shorter than that of silicon oxide.

The film thickness of the first insulating film 21 having an oxygen decomposition effect but having small diffusion length of impurity, such as aluminum oxide, hafnium oxide, or titanium oxide, is kept at a predetermined thickness. By disposing an insulating film having a larger diffusion length of impurity than the first insulating film 21, such as silicon oxide, over the first insulating film 21 as the second insulating film 22, it is possible to separate the impurity from the interface between the first insulating film 21 and the semiconductor. This makes it possible to reduce the impurity concentration in the vicinity of the interface.

Figure 5:
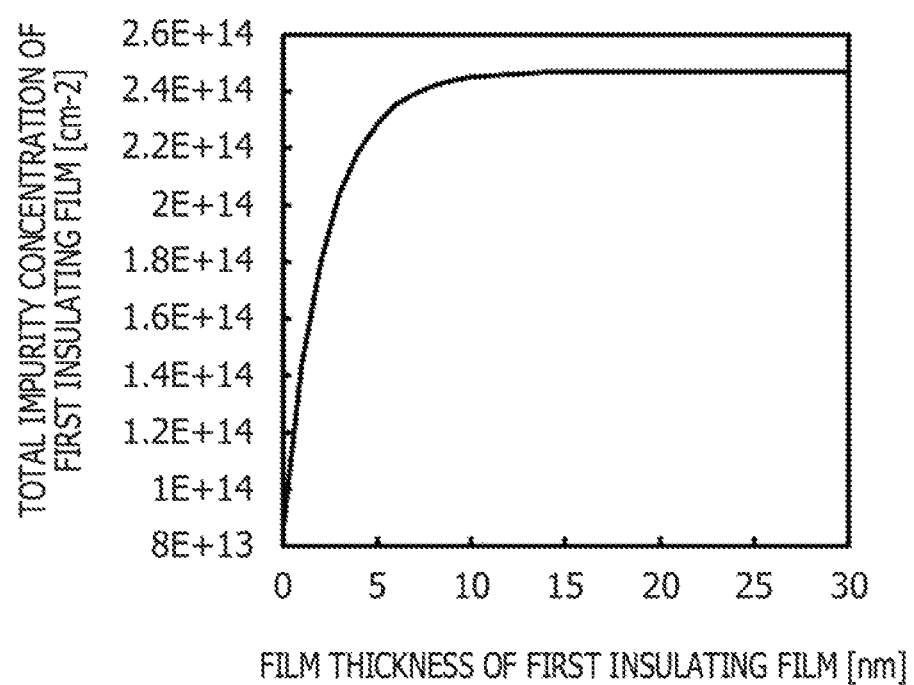
FIG. 5 illustrates a relationship between the film thickness of a first insulating film and the total impurity concentration in the film.

FIG. 5 illustrates a relationship between the film thickness of the first insulating film 21 and the total impurity concentration ($cm^{-2}$) in the film. Aluminum oxide is formed as the first insulating film 21, and the impurity concentration in the film thickness direction is measured by SIMS. When the film thickness of aluminum oxide exceeds 25 nm, the total impurity concentration in the first insulating film 21 is approximately saturated.

Even when the second insulating film 22 is disposed after making the thickness of the first insulating film 21 larger than 25 nm, the impurity concentration in the vicinity of the interface between the passivation layer 20 and the semiconductor does not decrease so much, and therefore the effect of removing impurity from the interface is not sufficiently obtained by disposing the second insulating film 22. From the viewpoint of the effect of reducing impurity, it is preferable that the thickness of the first insulating film 21 equal to or larger than a one-molecule layer and equal to or smaller than 25 nm. More preferably, it may be equal to or larger than a one-molecule layer and equal to or smaller than 10 nm.

Figure 6:
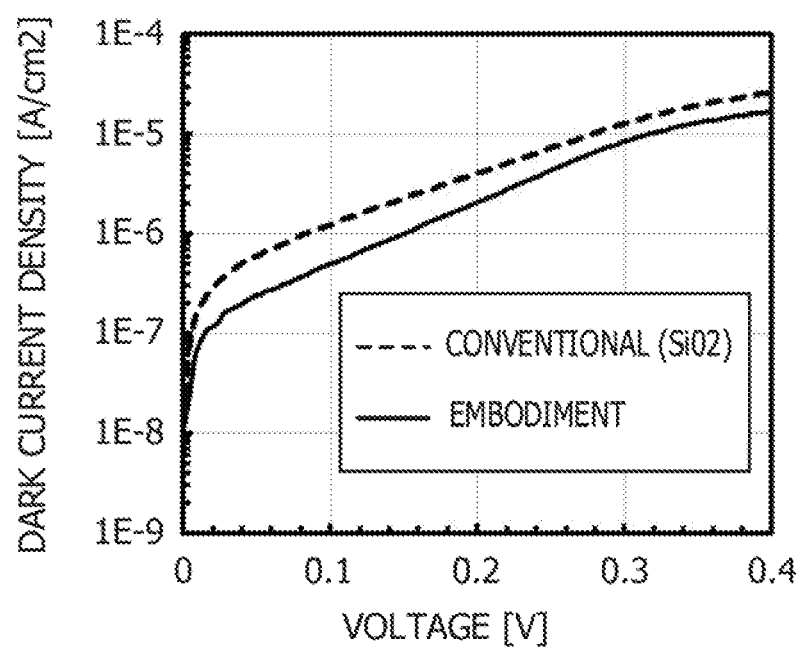
FIG. 6 illustrates an effect of a configuration of the embodiment.

FIG. 6 illustrates the effect of reducing the dark current in the embodiment. Current-voltage characteristics of the infrared detector 10 of the embodiment including the passivation layer 20 having a bilayer structure and a conventional infrared detector provided with only a passivation film of $SiO_2$ are illustrated in comparison. In a voltage range of 0 V to 0.4 V, the dark current density of the infrared detector 10 of the embodiment is reduced compared to the conventional configuration. In particular, the effect of reducing the dark current is large in the vicinity of 0.1 V, which is the operating voltage of the infrared detector 10.

MODIFICATION EXAMPLE

Figure 7:
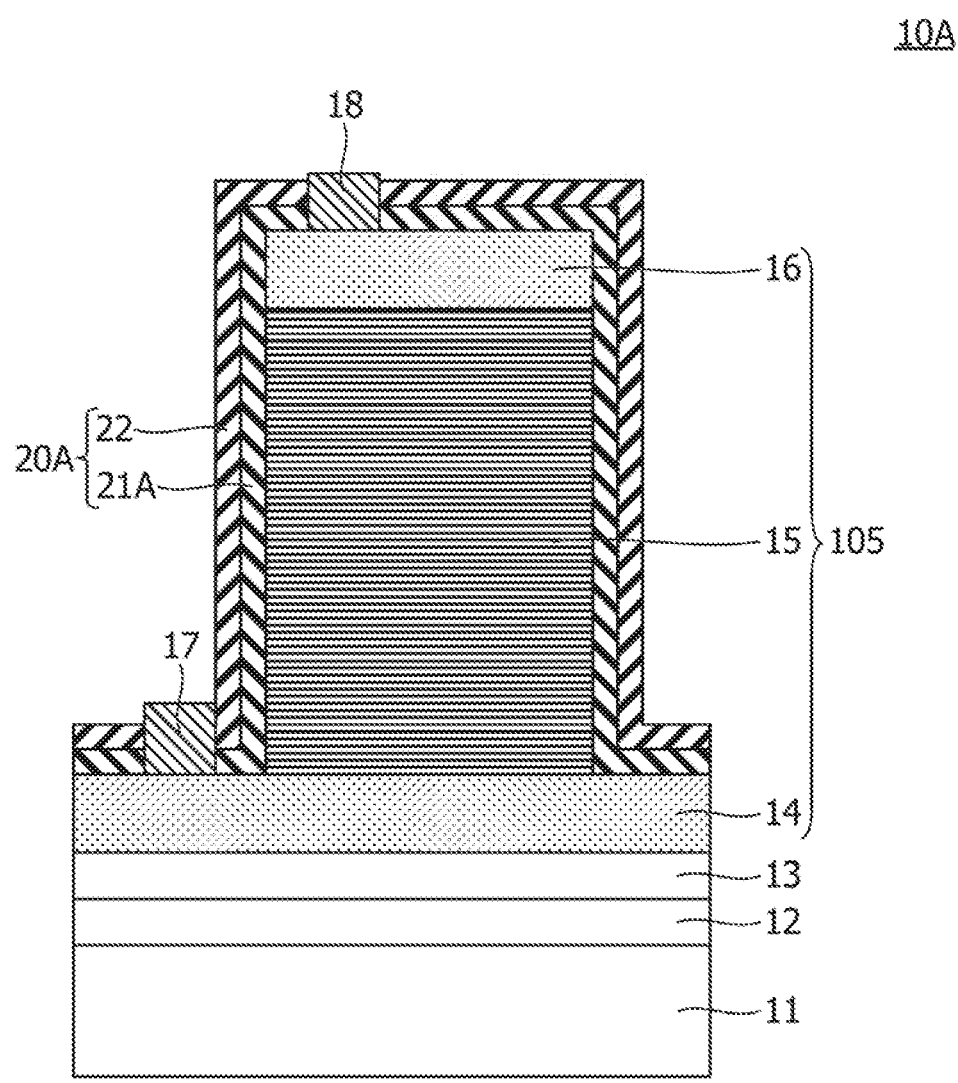
FIG. 7 illustrates a modification example of the infrared detector of the embodiment.

FIG. 7 is a schematic section view of an infrared detector 10A as a modification example of the embodiment. The infrared detector 10A has the same configuration as the infrared detector 10 of the embodiment except for a bilayer passivation layer 20A, and redundant description will be omitted.

The passivation layer 20A has a bilayer structure of a first insulating film 21A and the second insulating film 22. The first insulating film 21A is in contact with the laminate 105 of semiconductor to form a first interface. The second insulating film 22 covers the first insulating film 21A.

The first insulating film 21A contains an element having a low Gibbs free energy or low energy of oxide formation such as Al, Hf, Ti, or Zr in silicon oxide ($SiO_2$). The amount of addition of the element is adjusted in accordance with the material of the superlattice making up the laminate 105. When the superlattice includes a Ga-based compound semiconductor, the amount of addition is increased to obtain the first insulating film 21A that is more energetically stable. When the superlattice is formed from a compound semiconductor not containing Ga, the amount of addition may be reduced. Thereby, the oxide film over the surface of the laminate 105 is decomposed and reduced to suppress the cause of surface leakage.

The second insulating film 22 is a film having a larger diffusion length of impurity in the film than the first insulating film 21A, and is, for example, a silicon oxide film. By providing the second insulating film 22, it is possible to separate the impurity present in the interface between the laminate 105 and the first insulating film 21A and in the first insulating film 21A from the surface of the laminate 105.

The manufacturing process of the infrared detector 10A is the same as that of FIGS. 2A and 2B up to formation of the mesa 19. After the mesa 19 is formed, the first insulating film 21A covering all of the exposed surfaces of the second electrode layer 16, the light receiving layer 15, and the first electrode layer 14 is formed.

The first insulating film 21A is formed by growing a film of silicon oxide containing aluminum to a thickness of 25 nm by, for example, an atomic layer deposition method using trimethylaluminum and an organic aminosilane compound as precursors, and water as an oxidant source at a film formation temperature of 200° C. The silicon oxide containing aluminum contains aluminum oxide, and therefore has a lower Gibbs free energy than gallium oxide, antimony oxide, indium oxide, or arsenic oxide that constitutes the surface oxide film of the laminate 105. Therefore, the surface oxide film of the laminate 105 is decomposed and reduced.

Next, the second insulating film 22 that covers the first insulating film 21A and is formed from silicon oxide by, for example, a chemical vapor deposition method, is formed to 500 nm. Silicon oxide has a larger diffusion length of impurity such as carbon constituting organic compounds than silicon oxide containing aluminum. Therefore, it is possible to separate impurity from the interface between the laminate 105 and the first insulating film 21A.

<Imaging Device>

Figure 8A:
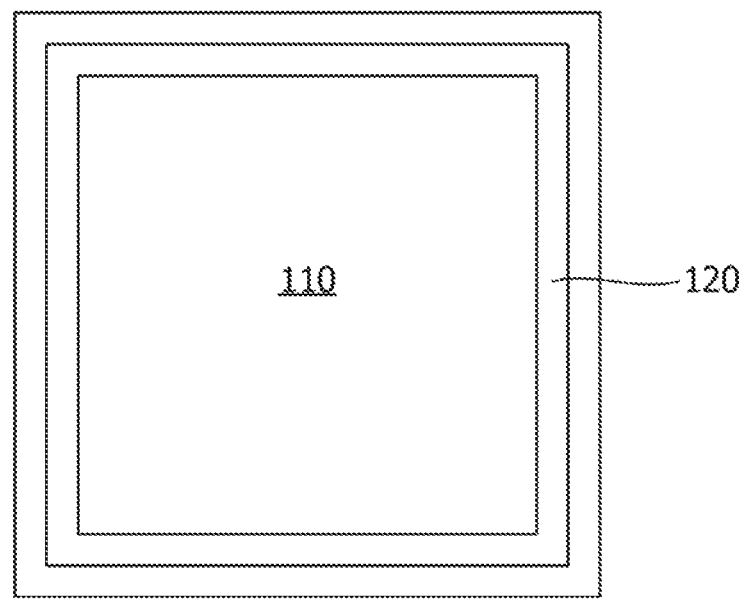
FIGS. 8A and 8B illustrate a schematic view of an imaging device including an infrared detector.
Figure 8B:
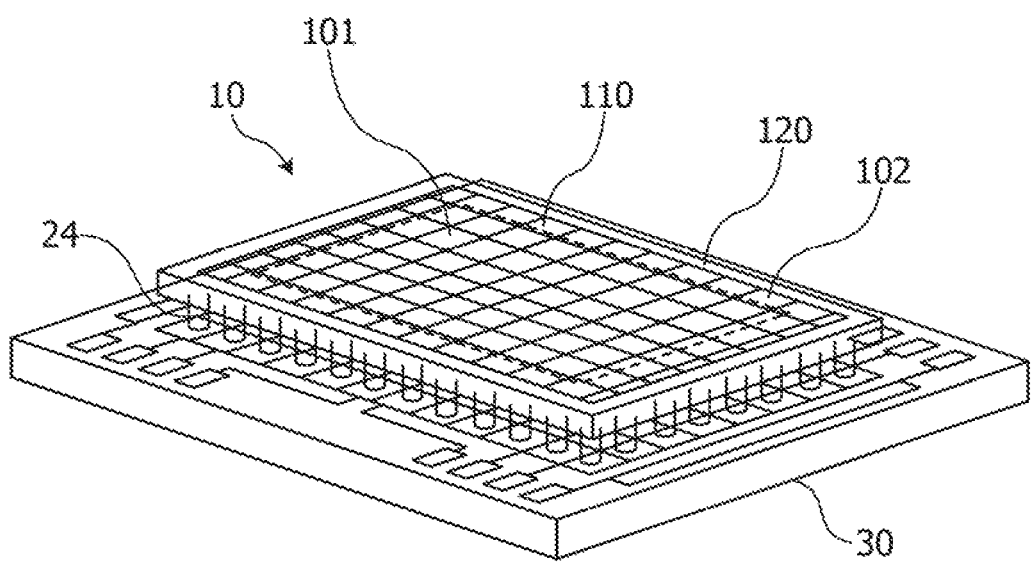

FIG. 8 (i.e., FIGS. 8A and 8B) illustrate a schematic view of an imaging device 50 including the infrared detector 10 according to the embodiment or an infrared detector 10A according to a modification example (hereinafter simply referred to as an infrared detector 10). FIG. 8A is a schematic plan view, and FIG. 8B is a schematic perspective view.

As illustrated in FIG. 8A, the infrared detector 10 includes pixels 101 arranged two-dimensionally, a pixel region 110 used for light detection, and a dummy region 120 disposed in the outer periphery of the pixel region. As will be described later, dummy pixels formed in the dummy region 120 are used to apply a common bias voltage to the first electrode layer 14.

As illustrated in FIG. 8B, the imaging device 50 includes the infrared detector 10 and a readout integrated circuit 30 electrically coupled to the infrared detector 10. The infrared detector 10 is flip-chip mounted over the readout integrated circuit 30 via bump electrodes 24. Prior to flip-chip mounting, the substrate 11, buffer layer 12 and etching stopper layer 13 may be removed if necessary.

A circuit such as a vertical scanning circuit (shift register), a horizontal scanning circuit (shift register), a horizontal reading circuit, or a noise canceller may be disposed along the outer periphery of the driving circuit 30. In addition, the entire imaging device 50 may be disposed in a cooling container such as a dewar, and held in a cryogenic environment.

Figure 9:
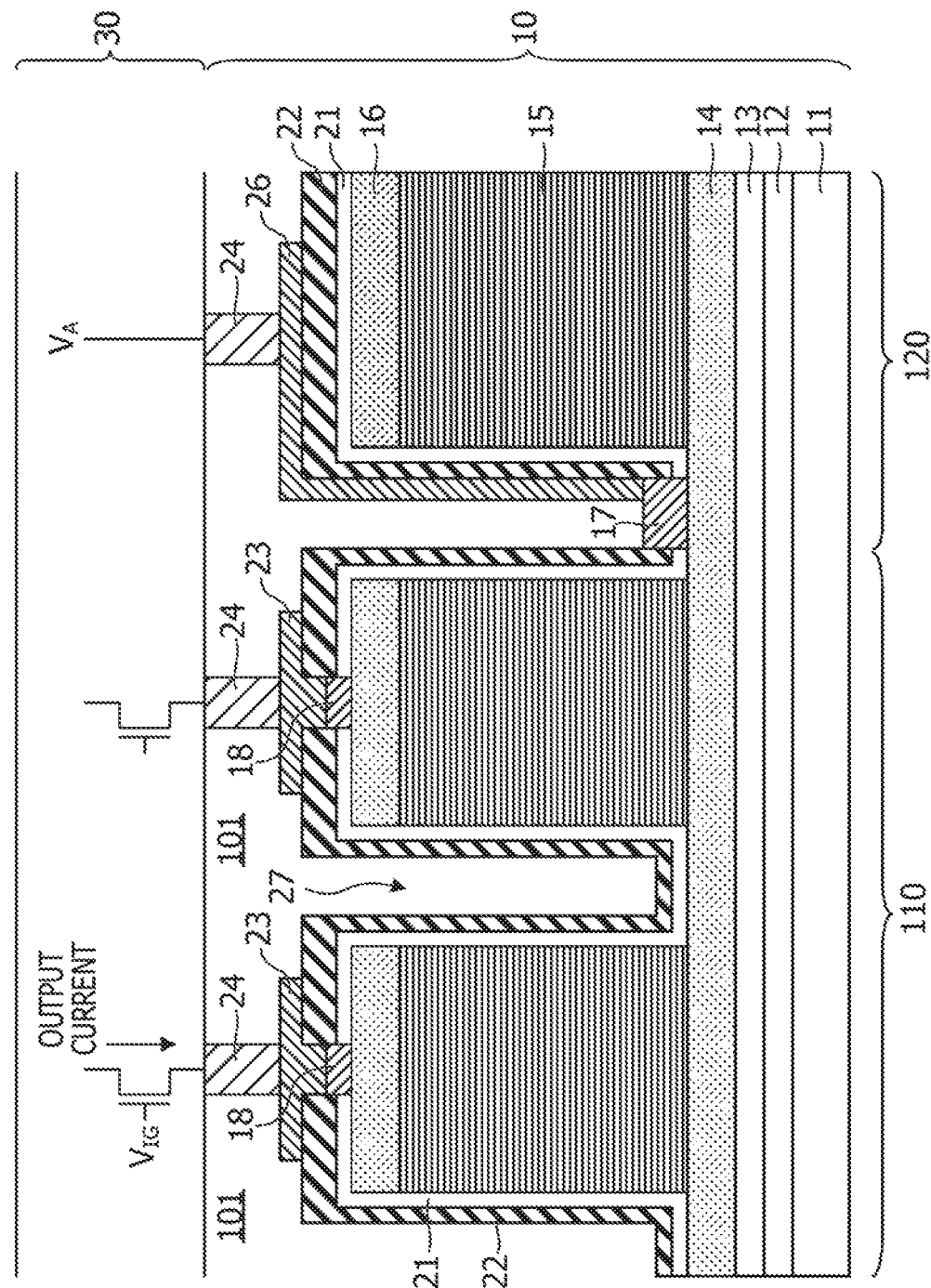
FIG. 9 is a diagram for describing a reading operation of an imaging device.

FIG. 9 is a diagram for describing a reading operation of the imaging device 50. Many pixels 101 having mesa shapes are arranged in a two-dimensional array shape in the pixel region 110 of the infrared detector 10 (see FIG. 8(B)). Dummy pixels 102 are formed in the dummy region 120 surrounding the pixel region 110. The dummy pixels 102 are formed in the same process as that of the pixels 101.

In the pixel region 110, adjacent pixels 101 are separated from each other by a pixel separation groove 27. The surface of each pixel 101 and the first electrode layer 14 are covered by two layers of the first insulating film 21 and the second insulating film 22.

The oxide film over the semiconductor surface of each pixel 101 is decomposed and removed by the first insulating film 21. The second insulating film 22 separates the impurity from the interface between the semiconductor and the first insulating film 21. Thus, the dark current is suppressed in each pixel 101, and the sensitivity and performance of the infrared detector 10 are improved.

In the upper surface of each pixel 101, a part of the first insulating film 21 and the second insulating film 22 is removed, and the ohmic electrode 18 and the electrode pad 23 coupled to the ohmic electrode 18 are formed. The bump electrodes 24 are formed over the electrode pads 23.

In the outermost periphery of the pixel region 110 or a boundary between the pixel region 110 and the dummy region 120, a part of the first insulating film 21 and the second insulating film 22 covering the upper surface of the first electrode layer 14 is removed, and the ohmic electrode 17 is formed.

In the same process as the formation of the electrode pad 23 of the pixel 101, surface wiring 26 coupled to the ohmic electrode 17 is formed. The surface wiring 26 is led to the upper surface of the dummy pixel 102, and is coupled to the bump electrode 24 of the dummy pixel 102.

As illustrated in FIG. 8 (i.e., FIGS. 8A and 8B), the infrared detector 10 having such a pixel arrangement is flip-chip mounted over the readout integrated circuit 30 via the bump electrodes 24.

In the operation of the imaging device 50, a negative bias $V_A$ is applied to the first electrode layer 14 of the infrared detector 10 via the bump electrodes 24 of the dummy pixels 102, the surface wiring 26, and the ohmic electrode 17.

A particular pixel 101 is selected by selecting a row and a column of the two-dimensional array. A positive bias is applied to the selected pixel 101 via the bump electrode 24. The infrared light incident on each pixel 101 is absorbed by the light receiving layer 15. Type-II superlattice forms minibands of electrons and holes, and infrared light corresponding to the energy difference of the minibands is absorbed. The photo excited carrier travels along an electric field generated by the application of the voltage, and a current corresponding to the incident amount of infrared light is led out to the readout integrated circuit 30 from the bump electrode 24. The read charges are accumulated in capacitors of reading unit cells provided in the readout integrated circuit 30 in correspondence with the respective pixels 101 of the infrared detector 10.

Figure 10:
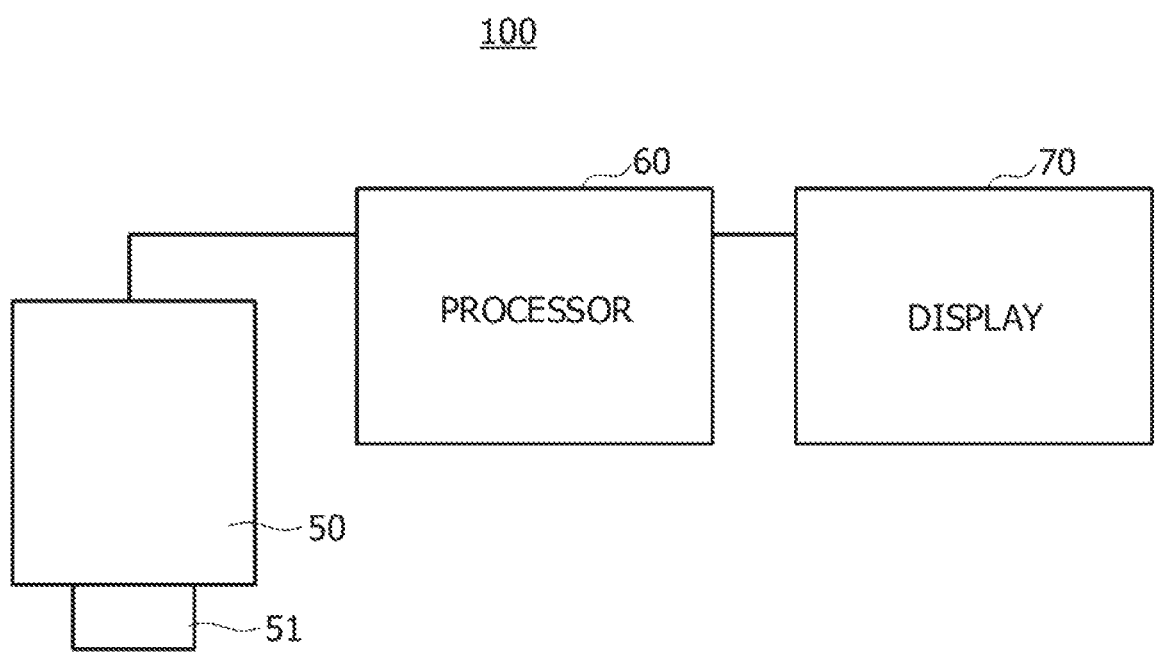
FIG. 10 is a schematic view of an imaging system.

FIG. 10 is a schematic view of an imaging system 100 including the imaging device 50. The imaging system 100 includes the imaging device 50 described above, a condenser lens 51 disposed on the light incident side of the imaging device 50, a processor 60 coupled to the imaging device 50, and a display 70. The imaging device 50 is used as an optical sensor, and sequentially reads a current from each pixel 101 and supplies the amount of read-out electric charges to the processor 60 as an electric signal.

The processor 60 may be a signal processing circuit such as a digital signal processor (DSP), or a logic device such as a field-programmable gate array (FPGA). Further, a dedicated image processing processor may be combined with these. The processor 60 performs analog-digital conversion, sensitivity correction, and the like, and thus generates an image signal. The generated image signal is supplied to the display 70, and an image corresponding to the infrared light incident on each pixel 101 is displayed.

Since the imaging system 100 includes the infrared detector 10 of a high sensitivity in which dark current is suppressed, it is possible to display an image of a measurement target object with high definition. The imaging system 100 is applicable to security systems, unmanned exploration systems, and the like, and since infrared light is detected, the imaging system 100 is also effectively applicable to night monitoring systems.

Although an embodiment and a modification example have been described above based on a specific configuration example, the present invention is not limited to the above-described configuration and method. Modification and replacement may be appropriately made within the range where it is possible to obtain the effect of suppressing the dark current.

The first insulating film 21 covering the laminate 105 of each pixel 101 and the second insulating film 22 may be crystalline or amorphous as long as they have insulation properties.

The first insulating film 21 may be anything as long as the first insulating film 21 has a lower Gibbs free energy than the oxide making up the surface oxide film of the laminate 105 including the light receiving layer 15, and is appropriately selected in accordance with the semiconductor material from which the laminate 105 is formed.

The composition of the first insulating film 21 and the second insulating film 22, and the composition of the semiconductor material from which the laminate 105 is formed are not limited. For example, a case where aluminum oxide is used for the first insulating film 21 is good as long as oxygen (O) and aluminum (Al) are contained as constituent elements, and the composition thereof may be $Al_2O_3$ or $AlO_x$. Similarly, in the case of using hafnium oxide, titanium oxide, or the like, these may be $HfO_2$ and $TiO_2$ or $HfO_x$ or $TiO_x$.

The formation temperature of the first insulating film 21 is not limited to 200° C., and may be about 200° C. or 200° C. or less. It is preferable that the temperature does not exceed 200° C. by a large margin because, when the first insulating film 21 is formed at a temperature exceeding 200° C. by a large margin, there is a possibility that the Sb oxide becomes thermally unstable and it becomes difficult to suppress the leakage current.

The precursor used for forming the first insulating film 21 is not limited to trimethylaluminum, and other organic aluminum compound gases may be used. The oxidizing agent may be an oxygen plasma or ozone.

Although the light receiving layer 15 is formed of a superlattice of InAs and GaSb having a predetermined film thickness, the thickness of each layer may be appropriately changed in accordance with the absorption wavelength. An InSb layer may be formed at the interface between InAs and GaSb for lattice-matching with the substrate 11 of GaSb. The superlattice may be formed from two or more of InAs, InSb, GaSb, and AlSb. An alloy of these two-element compounds may be used as long as the alloy is a material that responds to infrared light. For example, $InAs_{1-a}Sb_a$ (0≤a≤1) may be used.

The dopant with which the electrode layer is doped is not limited to Si and Be. For example, Te may be used as an n-type impurity and Zn may be used as a p-type impurity.

The method for laminating the infrared detector is not limited to the MBE method, and an MOCVD method or other methods by which it is possible to produce a laminated structure may be used. The method for forming the insulating film is not limited to the atomic layer deposition method and the chemical vapor deposition method, and a sputtering method or the like may be used.

In the structure of the infrared detector, the etching stopper layer 13 may be omitted. As a final form, the substrate 11 and the buffer layer 12 may be removed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An infrared detector comprising:
   a laminate of semiconductor in which a first electrode layer, a light receiving layer, and a second electrode layer are laminated in this order, the laminate of semiconductor being configured to contact a bottom of the light receiving layer with the first electrode layer and to contact a top of the light receiving layer with the second electrode layer and not to contact at least a part of a side of the light receiving layer with the first electrode layer and the second electrode layer;
   an ohmic electrode formed at least in part on the top of the first electrode layer;
   a first insulating film configured to be in contact with the laminate and covers a surface of the laminate, the first insulating film being in contact with at least the side of the light receiving layer and being configured not to cover at least a portion of a top of the ohmic electrode, the first insulating film consisting of at least any of aluminum oxide, hafnium oxide, titanium oxide, zirconium oxide, or silicon oxide containing one or more elements selected from aluminum, hafnium, titanium, and zirconium; and
   a second insulating film configured to be in contact with and covers a surface of the first insulating film opposite to an interface between the first insulating film and the laminate, the second insulating film being configured not to cover at least a portion of a top of the ohmic electrode, the second insulating film being formed by using at least any of silicon oxide or silicon nitride such that an impurity of the second insulating film is diffused from an interface between the first insulating film and the second insulating film to a surface of the second insulating film opposed to the first insulating film,
   the first insulating film is configured to have a lower Gibbs free energy than an oxide of a material from which the laminate is formed, and
   in the second insulating film, diffusion of impurity is larger than in the first insulating film.

2. The infrared detector according to claim 1, wherein a thickness of the first insulating film is 25 nm or less.

3. The infrared detector according to claim 1, wherein the second insulating film is a film selected from silicon oxide and silicon nitride.

4. The infrared detector according to claim 1, wherein the impurity is carbon or hydrogen.

5. The infrared detector according to claim 1, wherein the light receiving layer is formed of a Type-II superlattice.

6. An imaging device comprising:
   the infrared detector according to claim 1; and
   a driving circuit electrically coupled to the infrared detector.

7. A manufacturing method for an infrared detector, the manufacturing method comprising:
   forming a laminate of semiconductor in which a first electrode layer, a light receiving layer, and a second electrode layer are laminated in this order, the laminate of semiconductor being configured to contact a bottom of the light receiving layer with the first electrode layer and to contact a top of the light receiving layer with the second electrode layer and not to contact at least a part of a side of the light receiving layer with the first electrode layer and the second electrode layer;
   forming an ohmic electrode placed at least in part on the top of the first electrode layer;
   forming, from a first material having a lower Gibbs free energy than an oxide of a material from which the laminate is formed, a first insulating film that is in contact with the laminate and covers a surface of the laminate, the first insulating film being in contact with at least the side of the light receiving layer and being configured not to cover at least a portion of a top of the ohmic electrode, the first insulating film consisting of at least any of aluminum oxide, hafnium oxide, titanium oxide, zirconium oxide, or silicon oxide containing one or more elements selected from aluminum, hafnium, titanium, and zirconium; and
   forming, from a second material in which diffusion of impurity in a film is larger than in the first insulating film, a second insulating film that is in contact with the first insulating film and covers the first insulating film, the second insulating film being configured not to cover at least a portion of a top of the ohmic electrode, the second insulating film being formed by using at least any of silicon oxide or silicon nitride such that an impurity of the second insulating film is diffused from an interface between the first insulating film and the second insulating film to a surface of the second insulating film opposed to the first insulating film.

* * * * *